(12) United States Patent
Shelton et al.

(10) Patent No.: US 9,209,787 B2
(45) Date of Patent: Dec. 8, 2015

(54) SEMICONDUCTOR DEVICE CONTROLLERS

(71) Applicant: Amantys Ltd, Cambridge, Cambridgeshire (GB)

(72) Inventors: Edward Shelton, Cambridge (GB); Mark Snook, Cambridge (GB)

(73) Assignee: MASCHINENFABRIK REINHAUSEN GMBH, Regensburg (DE)

( * ) Notice: Subject to any disclaimer, the term of this patent is extended or adjusted under 35 U.S.C. 154(b) by 0 days.

(21) Appl. No.: 14/367,311

(22) PCT Filed: Nov. 19, 2012

(86) PCT No.: PCT/GB2012/052859
§ 371 (c)(1),
(2) Date: Jun. 20, 2014

(87) PCT Pub. No.: WO2013/093410
PCT Pub. Date: Jun. 27, 2013

(65) Prior Publication Data
US 2014/0368240 A1  Dec. 18, 2014

(30) Foreign Application Priority Data
Dec. 23, 2011 (GB) .................................. 1122288.2

(51) Int. Cl.
*H03K 17/687* (2006.01)
*H03K 3/012* (2006.01)
(Continued)

(52) U.S. Cl.
CPC ................ *H03K 3/012* (2013.01); *H03K 3/013* (2013.01); *H03K 17/063* (2013.01);
(Continued)

(58) Field of Classification Search
USPC .......... 327/427, 432–434, 407–408, 411, 109
See application file for complete search history.

(56) References Cited

U.S. PATENT DOCUMENTS

| 4,337,494 A | 6/1982 | Huykman |
| 5,390,070 A * | 2/1995 | Niedermeier ................. 361/152 |

(Continued)

FOREIGN PATENT DOCUMENTS

| DE | 3826509 A1 | 6/1989 |
| DE | 102005045957 A1 | 11/2006 |

(Continued)

OTHER PUBLICATIONS

International Search Report and Written Opinion from corresponding International Application No. PCT/GB2012/052859, mailed Jan. 31, 2013.
Wang Y et al., "Real-time Optimization of IGBT/Diode Cell Switching under Active Voltage Control", dated Oct. 1, 2006.

(Continued)

*Primary Examiner* — An Luu
(74) *Attorney, Agent, or Firm* — Andrew Wilford

(57) ABSTRACT

We describe a controller (130) for controlling a power semiconductor switching device (132) into a selected one of a plurality of states, the states including a fully-off state, a saturated-on state, and at least one intermediate state. The switching device controller includes a voltage sense input (142) to sense a voltage on the device; a current sense input (current feedback) to sense a current passing through the device; a negative feedback control circuit (138) coupled to the sense inputs, a control output (136) to provide to the power semiconductor switching device a drive signal with a response dependent on one or more adjustable parameters; and a circuit controller (140) to control the adjustable parameters responsive to state command data, to control the switching device into a selected state, in particular by controlling an effective resistance of the device. Preferred intermediate states include an active low current state and an active low voltage state.

26 Claims, 7 Drawing Sheets

(51) Int. Cl.
  *H03K 17/082* (2006.01)
  *H03K 17/18* (2006.01)
  *H03K 17/16* (2006.01)
  *H03K 17/10* (2006.01)
  *H03K 17/12* (2006.01)
  *H03K 3/013* (2006.01)
  *H03K 17/06* (2006.01)

(52) U.S. Cl.
  CPC ....... *H03K 17/0822* (2013.01); *H03K 17/0828* (2013.01); *H03K 17/107* (2013.01); *H03K 17/127* (2013.01); *H03K 17/166* (2013.01); *H03K 17/168* (2013.01); *H03K 17/18* (2013.01)

(56) References Cited

U.S. PATENT DOCUMENTS

| | | | |
|---|---|---|---|
| 5,889,663 | A | 3/1999 | Tabata et al. |
| 2004/0056646 | A1 | 3/2004 | Thalheim |
| 2010/0060326 | A1* | 3/2010 | Palmer et al. .................. 327/109 |

FOREIGN PATENT DOCUMENTS

| | | |
|---|---|---|
| EP | 2445110 A | 7/1948 |
| GB | 2488778 A | 9/2012 |

OTHER PUBLICATIONS

Search Report from corresponding UK Application No. GB1122288.2, dated Mar. 18, 2013.

* cited by examiner

SEMICONDUCTOR DEVICE CONTROLLERS

FIELD OF THE INVENTION

This invention relates to techniques for controlling semiconductor switching devices, in particular power semiconductor switching devices.

BACKGROUND TO THE INVENTION

The power semiconductor switching devices with which we are particularly concerned typically have a current carrying capability of greater than 1 amp and are operable with a voltage of greater than 100 volts. Embodiments of the devices with which we are concerned are able to carry currents of greater than 10 amps, 50 amps or 100 amps and/or are able to sustain a voltage difference across the device of greater than 500 volts or 1 KV.

Examples of such devices include insulated gate bipolar transistors (IGBTs), as well as FETs such as MOSFETS (vertical or lateral) and JFETs, and potentially devices such as LILETs (lateral inversion layer emitter transistors), GTOs (Gate Turn-Off thyristors). IGCTs (Integrated Gate Commutated Thyristors) and the like. The techniques we will describe are not limited to any particular type of device architecture and thus the power switching devices may be, for example, either vertical or lateral devices; they may be fabricated in a range of technologies including, but not limited to, silicon, and silicon carbide.

Switching devices of this type have applications which include switching in high voltage transmission lines, in particular dc transmission lines of the type which may, for example, carry power from an offshore wind installation, and medium voltage (for example greater than 1 KV) switching for motors and the like, for example locomotive motors.

There are particular problems in controlling such devices, in part because the high currents/voltages involved mean that an error, for example, an error in the control system or excessive power dissipation or over voltage of a power switching device, can have potentially serious consequences. In addition these devices often operate in electrically noisy environments and, further, 10s or 100s of devices may be connected in series and/or parallel to achieve the desired ratings. In such an arrangement switching of the devices needs to be carefully synchronised. It is also preferable that the control techniques can address a situation where one of many connected devices fails.

SUMMARY OF THE INVENTION

According to the present invention there is therefore provided a semiconductor switching device controller for controlling a semiconductor switching device into a selected one of a plurality of states, the states including a fully-off state, a saturated-on state, and at least one intermediate state between said fully-off state and said saturated-on state, said semiconductor switching device having first and second input/output terminals and a control terminal, the switching device controller comprising: an interface to receive device command data and defining a commanded said state for said switching device; a voltage sense input to sense a voltage on a said input/output terminal; a current sense input to sense a current passing through said semiconductor switching device via said input/output terminals; a control output to provide a drive signal to said control terminal; a feedback control circuit coupled to said voltage sense input, to said current sense input and to said control output, to provide said drive signal responsive to said sensed voltage and sensed current, wherein said feedback control circuit has one or more adjustable parameters, and wherein said a response of said drive signal to said sensed voltage and sensed current is dependent on said one or more adjustable parameters; and a circuit controller coupled to said interface and to said feedback control circuit, wherein said circuit controller is configured to control said one or more adjustable parameters responsive to said command data; and wherein a state of said one or more adjustable parameters determines a state of said switching device set by said drive signal from said feedback control circuit, and wherein said commanded states define states of said one or more adjustable parameters for said circuit controller to control said semiconductor switching device into said fully-off state, said saturated-on state, and said at least one intermediate state.

Embodiments of such a controller enable potentially many hundreds of power semiconductor switching devices to be switched in a controlled, synchronised manner. Broadly speaking providing one or more intermediate states between the fully-off and saturated-on state enables a conduction state of the device to be controlled, and thus the conduction states of multiple devices to be controlled to change in lockstep. As well as synchronising switching, this also helps to ensure that a current/voltage load is shared evenly across multiple devices. The adjustable parameter(s) used to determine a state of the switching device may be a current or voltage value, such as a gate voltage reference level, and/or a scaling or offset parameter of one or more feedback loops of the feedback control circuit (as described further later), and/or a parameter defining the state of a switch forming part of a control loop of the controller.

The controlled power semiconductor switching device may be any of a range of devices including those of the types mentioned in the introduction, but embodiments of the invention are particularly advantageous when applied to an insulated gate device, preferably an IGBT (Insulated Gate Bipolar Transistor) or MOSFET. Preferably with such a device the feedback control circuit comprises a controllable current drive circuit to control a charge flowing into/out of the control terminal (gate) of the switching device as the one or more adjustable parameters are changed. This facilitates driving the gate capacitor and (variable) Miller capacitance. Although these capacitances could be driven by a low impedance voltage source this can be difficult to control. By contrast, current (charge) control facilitates accurate control of the rate of change of voltage across the device, and rate of change of current through the device, with time.

In some particularly advantageous implementations of the controller, the feedback control circuit is a negative feedback circuit, the parameter(s) comprise control loop gain parameters of the circuit, and the circuit is configured to control the switching device to a resistance value, the circuit controller controlling the loop gain parameters to adjust the resistance value to thereby move the switching device between states.

Thus embodiments of the controller provide a control system employing negative feedback in such a way as to control the behaviour of the switch device based upon sensed voltage and current feedback signals to make the switch device behave as if it were a passive resistance. One can then change the parameters of this control loop to change this effective resistance, thus moving the device from a high resistance, say, to a low resistance. A by-product of this change in resistance is to achieve a "switch transition event" in the external circuit that is being switched. Thus in embodiments the control system has a number of scaling parameters that control the behaviour of the switch device in the control loop, and these can be adjusted to make the switch device behave as if it were a passive resistor. This relates to ohms law, R=V/I, that is by changing the perceived feedback values of V and I the circuit changes the effective R of the control loop.

The feedback control circuit may be implemented either in analogue circuitry, or in digital circuitry, or a combination of both.

Some preferred embodiments of the controller include a switching device state detection system to detect when a commanded intermediate state has been achieved, and in response to send back acknowledgment data over the interface. This facilitates synchronisation of multiple devices for switching in lockstep. Depending upon the intermediate state detected the state detection system may sense one or more of a control terminal (gate) voltage, a voltage across the device, and a current through the device.

In some preferred embodiments a plurality of defined, intermediate states are provided by the controller in addition to the fully-off and saturated-on states. In the fully-off state the switching device is turned off and the current through the device is substantially zero—that is only leakage current flows. One subsequent intermediate state which may be provided is an off-threshold state, in which the switching device is still turned off but with a gate voltage greater than that for the fully-off state (more particularly greater than zero), but less than a turn-on threshold voltage of the device. Optionally the controller may be configured to learn the value of this voltage from the device itself (which it is able to do because the gate voltage can be controlled and the current the device is passing can be sensed). A further intermediate state which may be provided is the 'mirror image' of this state, that is an on-threshold state in which the gate voltage is less than that for a saturated-on (saturated) state of the device but greater than a turn-off threshold of the device. Again this on-threshold voltage may be learnt by the controller and/or adjusted depending upon the sensed voltage across the device. Alternatively the controller may include one or more registers defining these voltage values in volatile or non-volatile memory (programmed values may be derived, for example, from a device datasheet).

Embodiments of the analogue control circuit may include a feedback loop from the control output to control the drive signal voltage to a value defined by an adjustable voltage control parameter. This parameter may then be adjusted (which here includes selected) to control the device into the off-threshold or on-threshold state. Where such a threshold state control feedback loop is provided for the analogue control circuit, preferably this is switchable so that this feedback loop may be switched out and another control loop switched in (as described later). Thus, more generally, embodiments of the controller have multiple feedback loops and a desired feedback loop may be switchable selected, for example under control of the circuit controller, which is typically a digital controller.

Control of the switching device from a fully-off state to an off-threshold state, and from a saturated-on state to an on-threshold state (and vice versa) may be performed quasi-statically, more particularly by controlling the gate voltage only, since there is little or no change in the high current/voltage passed/across the device. However some preferred embodiments of the controller also provide one or more defined active intermediate states, where the switching device is active in the sense that the current/voltage through/across the device is controlled and the device is not turned fully off or wholly on—more precisely, where the switching device is on but not in its saturated-on state. In such an active state the feedback control circuit comprises a control loop for active control of the current through and voltage across the power device, controlling one or more parameters of this control loop to achieve the commanded active state. Thus for this active state control the previously described threshold state control loop may be switched out, if implemented. In some particularly preferred embodiments the feedback control circuit controls the switching device to a target resistance and the circuit controller controls this target resistance to achieve the desired active state. Thus, broadly speaking, some preferred implementations of the switching device controller in effect make the power semiconductor switching device behave like a passive resistor.

Embodiments of this active state control loop facilitate bi-directional control of a switching device between different intermediate active states. This is useful as it enables a device to be controlled back to a previously 'known good' or to some other safe state if a fault is detected, for example in the controlled device or in another device the failure of which might affect the controlled device. This can be helpful in limiting collateral damage, since in a high power system the failure of one device can often cause a chain reaction leading to the failure of other devices.

One preferred active state implemented by the controller is an active low current state, in which the switch is active but in a state where there is a defined low current flowing through the device but near to full voltage across the device. Thus in such an active low current state the sensed current is greater than zero but still relatively low, at least less than the saturated-on current, for example less than 5 amps, 1 amp, 0.1 amp, 10 mA, 1 mA or 100 μA. The voltage across the device in this state may be greater than 100 volts, 500 volts or 1 KV, for example greater than 90% of a maximum value of the sensed voltage. In principle, however, in the low current state there may be any voltage across the device (this may even be negative if a reverse parallel diode is conducting because current is reversed through switch, as can occur when driving inductive loads).

Another useful active state implemented in embodiments of the controller is an active low voltage state in which there is a defined low voltage across the device (a voltage above the saturation voltage but less than the fully-off voltage/full switched supply voltage). Thus in embodiments the sensed voltage across the device in this state may be less than 50 volts, 30 volts or 20 volts, for example of order 10 volts; or less than 10% or 5% of a maximum voltage of the sensed voltage. Further the sensed voltage is greater than that for the saturated-on state (which may be, for example, of order 2 volts) and thus the sensed voltage may be greater than 2 volts, 3 volts, 5 volts or 10 volts. In the active low voltage state there may be near to full current going through the device, although in principle there may be any current flowing through the device in this state.

As previously mentioned, in some preferred implementations the active state control loop controls the switching device to behave like a passive resistance. Thus in embodiments the active state control loop comprises a first control circuit coupled to the voltage sense input and incorporating a circuit responsive to a voltage-scaling parameter, and a second control circuit coupled to the current sense input and incorporating a circuit responsive to a current-scaling parameter. The active state control loop may then combine these two scaled parameters, for example in a differencing circuit. The combined result may then be used to control the drive signal from the control output. In this way the (digital) circuit controller may control a transition to/from/between an active state or states by changing one or both of the voltage-scaling and current-scaling parameter to, in effect, change the target resistance for the device.

In preferred embodiments the controller implements both the two active intermediate states and the two threshold intermediate states using a combined control circuit with a pair of switchable control loops, one for each of the respective pairs of active and threshold intermediate states.

In a related aspect the invention provides a method of using a switching device controller to control switching of a semiconductor switching device, the method comprising: receiving a command to switch said semiconductor switching device from an initial fully-off or saturated-on sate to an intermediate state; controlling said semiconductor switching device from said initial state into said intermediate state; determining that said semiconductor switching device is in said intermediate state; acknowledging, responsive to said determining, that said switching device is in said intermediate state; receiving, subsequent to said acknowledging, a further command to switch from said intermediate state to a subsequent state; and controlling said semiconductor switching device into said subsequent state.

In embodiments, providing one or more defined intermediate states to which the switching device can be controlled, and sending an acknowledgement signal when the defined intermediate state is achieved, facilitates controlling a plurality of such devices in synchronism. Further, embodiments of the method also enable a device to be controlled back from the intermediate state to a previous state, for example on detection of failure of the or another device, as a fail-safe mechanism.

In some preferred embodiments of the method the switching device is controlled into a plurality of successive intermediate states when switching between the fully-off and saturated-on state, reporting each of these intermediate states and awaiting a subsequent state-change command before moving to the subsequent state. As previously mentioned, in some preferred embodiments the intermediate states comprise one or more of an off-threshold state, an on-threshold state, an active low current state, and an active low voltage state.

In a related aspect the invention provides a switching device controller for controlling a semiconductor switching device, the switching device controller comprising: an interface for receiving commands and sending acknowledgments; means for receiving a command to switch said semiconductor switching device from an initial fully-off or saturated-on state to an intermediate state; means for controlling said semiconductor switching device from said initial state into said intermediate state; means for determining that said semiconductor switching device is in said intermediate state; means for acknowledging, responsive to said determining, that said switching device is in said intermediate state; and means for receiving, subsequent to said acknowledging, a further command to switch from said intermediate state to a subsequent state; and means for controlling said semiconductor switching device into said subsequent state.

As previously described, some preferred embodiments of the power semiconductor switching device controller make the controlled switching device behave effectively as a passive resistor.

Thus in a further aspect the invention provides a semiconductor switching device controller for controlling a semiconductor switching device, said semiconductor switching device having first and second input/output terminals and a control terminal, the switching device controller comprising: a control input to receive a control signal for controlling a state of said semiconductor switching device; a voltage sense input to sense a voltage on a said input/output terminal; a current sense input to sense a current passing through switching device via said input/output terminals; a control output to provide a drive signal to said control terminal; and a feedback control system coupled to said voltage sense input, to said current sense input and to said control input and to said control output; wherein said control signal defines a target effective resistance of said semiconductor switching device, and wherein said feedback control circuit is configured to control said drive signal such that said sensed voltage and said sensed current together implement said target effective resistance.

Again, the controller may be implemented in analogue circuitry, or in digital circuitry (optionally including circuitry under partially or wholly under software control), or a combination of the two.

The control signal may define the target resistance in terms of one of a set of a target switch states. In some preferred embodiments the control input controls the voltage-scaling and current-scaling parameter of the respective control circuits, to define a target effective resistance for the device/circuit. As previously mentioned the state of the device can then be controlled by changing this target effective resistance, to control the device from one state to another. In preferred embodiments signals from the first and second control circuits are differenced and the resulting error signal is used to control the driver circuit, more particularly the gate drive circuit. The driver circuit (gate drive circuit) is preferably a current (charge metering) driver circuit, as previously mentioned.

The behaviour of the complete control system as measured by the sensed voltage and current, gives the device an effective resistance, and the scaling parameters define the target effective resistance. Thus, in embodiments a negative feedback control system is configured to give a drive signal proportional to the difference between the defined target resistance and the actual effective resistance as measured through the sensed voltage and current, in such a way as to drive this difference to zero.

In embodiments the difference signal is the control loop error signal which, due to negative feedback, drives the control gate of the main switch device in such a direction and with a magnitude proportional to this error, so as to reduce this error signal to zero over time. This is an important operating principle of embodiments of the controller as this facilitates control of a switch device that is inherently non-linear and, in particular, turns an inherently non-linear device into something that behaves like a passive resistor, having a linear resistance, quite differently to its natural characteristics.

In a further related aspect the invention provides a method of controlling a semiconductor switching device, the method comprising: sensing a voltage across first and second input/output terminals of the semiconductor switching device; sensing a current flowing between said first and second input/output terminals through said semiconductor switching device; and controlling a signal on a control terminal of said semiconductor switching device responsive to said sensed voltage and current such that said semiconducting switching device behaves like a passive resistor.

Again, in preferred embodiments the switching device has an insulated gate. A charge injected onto and/or removed from the gate is controlled, to control an electric field on the gate, and more particularly to control a ratio of the sensed voltage to the sensed current, to thereby achieve a target effective resistance for the switching device in one or more of its intermediate states.

In a still further related aspect the invention provides a semiconductor switching device controller for controlling switching of an IGBT, the switching device controller comprising: a set of one or more registers to store data defining one or more of a target gate voltage value, Vg, a target collector current value, Ic, a target collector-emitter voltage value, Vce, and a target effective resistance value Re; a feedback control loop configured to control said Vg, Ic and Vce of said IGBT; and a controller to control said feedback control loop in accordance with said stored data to target one or more of said Vg, Ic, Vce and Re for said IGBT; and wherein said controller is configured to target intermediate states defined by one or more of said Vg, Ic, Vce and Re to control said switching of said IGBT.

In embodiments the registers store, as well a Vg value for a state, a pair of Ic and Vce values and/or an Re value (defining a target resistance of the complete control system/IGBT). The controller may then be configured to hold the IGBT in each of a plurality of intermediate states, where each is defined by one or more of the stored Vg, Ic, Vce, and Re values. A corresponding technique can be used to control a MOSFET.

Thus in a corresponding aspect there is provided a semiconductor switching device controller for controlling switching of a MOSFET, the switching device controller comprising: a set of one or more registers to store data defining one or more of a target gate voltage value, Vg, a target drain current value, $I_D$, a target drain-source voltage value, $V_{DS}$, and a target effective resistance value Re; a feedback control loop configured to control said Vg, $I_D$ and $V_{DS}$ of said MOSFET; and a controller to control said feedback control loop in accordance with said stored data to target one or more of said Vg, $I_D$, $V_{DS}$ and Re for said MOSFET; and wherein said controller is configured to target intermediate states defined by one or more of said Vg, $I_D$, $V_{DS}$ and Re to control said switching of said MOSFET.

BRIEF DESCRIPTION OF THE DRAWINGS

These and other aspects of the invention will now be further described, by way of example only, with reference to the accompanying figures in which:

FIGS. 2a and 2b show, respectively, an example of a power semiconductor switching device control system in a bridge application, and details of arrangement of FIG. 2a;

DETAILED DESCRIPTION OF PREFERRED EMBODIMENTS

Figure 1:
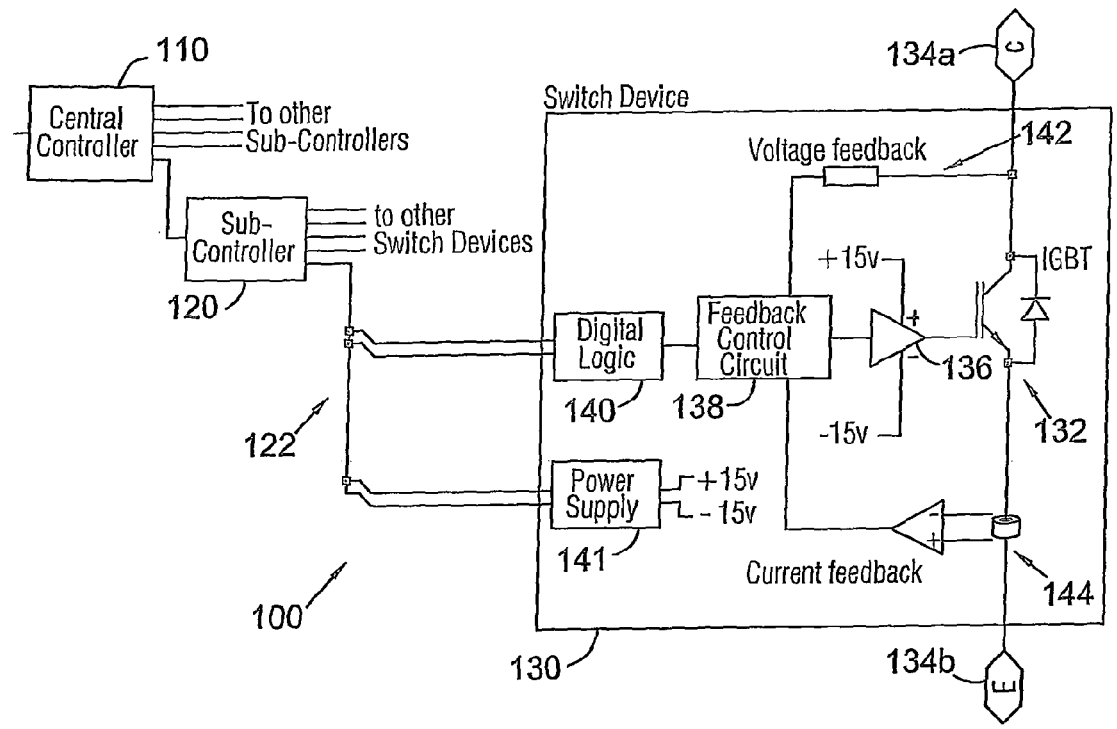
FIGS. 1a and 1b show, respectively, a switching device controller according to an embodiment of the invention in combination with a coordinating control system comprising a central controller coupled to a sub-controller, and details of digital logic for the controller.

Referring to FIG. 1, an example of a power semiconductor switching device control system 100 comprises a central controller 110 coupled to a plurality of sub-controllers 120 (just one is illustrated), in turn coupled to a plurality of switching device controllers 130 (again just one is illustrated). Although in the example of FIG. 1 a sub-controller is provided the control system may employ just a central controller, or may employ multiple levels of (nested) sub-controllers. A power electronics system or circuit generally comprises a plurality of switches each of which may comprise one, or typically multiple switch devices. In the example of FIG. 1 the power semiconductor switching device is an IGBT 132, although other devices such as MOSFETs, JFETs and the like may also be employed.

As illustrated, the switching device controller (switch device) 130 comprises digital logic to interface with a bus 122 connecting the device controller 130 to the sub-controller 120. In preferred embodiments the device controller 130 also receives power over this bus and the controller includes a power supply circuit 141 to derive power from the bus for powering the low voltage portions of the device controller/switch device 130. In operation the digital logic 140 receives commands and configuration information over bus 122 and replies with acknowledgement and other data. For more details reference may be made to our co-pending UK patent applications filed on the same day as this application.

The digital logic 140 interfaces with feedback control circuitry 138 coupled, in the illustrated example, to a gate driver 136, driving IGBT 132. In one example implementation the feedback control circuitry comprises a mixture of analogue and digital circuitry. In the illustrated example, the connection between a switch device controller and a sub-controller is a high speed point-to-point link, but a shared bus may also be employed. In one embodiment the connection comprises a twisted copper wire pair; the same pair or an additional pair may be employed to provide a power supply to the switching device controller. Alternatively a fibre optic connection may be employed. Such arrangements facilitate high speed data transfer, for example greater than 100 Mbit/s or 1 Gbit/s, for controlling transitions between switching states.

Figure 6:
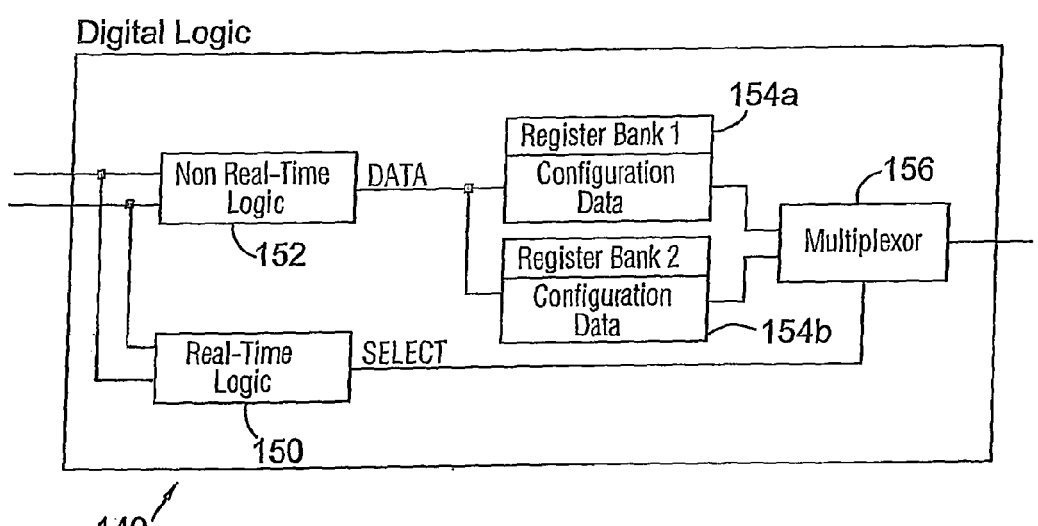
FIG. 6 shows a switching device controller incorporating a pair of configuration register banks.

FIG. 6, described further later, shows details of the digital logic 140 of FIG. 1.

As mentioned later, a switch state is requested by a real-time message from the central controller (and similarly acknowledged when achieved), whilst configuration and monitoring data can be sent and received by non-real-time messages. Thus the interface to bus 122 comprises real-time logic 150 and non real-time logic 152. In embodiments the controller includes two register banks 154a,b storing configuration data which is selectable by multiplexor 156. The register banks are programmed by the digital logic, which also controls which register bank is active, and which one can be written to. The register bank that is active provides parameter information that sets up the state of the active feedback control loop described later. The register bank that is not active can be updated via the communications interface, and then made active so that this new parameter data controls the system state. This enables real-time update of the controller configuration, and synchronised update in a system with many switches/controllers.

As described in more detail later, preferred embodiments of the switching device controller 130 of FIG. 1 include a voltage sensing circuit 142 to sense a voltage on the semiconductor switching device and a current sensing circuit 144, to sense a current passing though the device. In some preferred embodiments of the overall system data from either or both of these sensing circuits may be fed back on request, to one or both of the sub-controller 120 and central controller 110.

Figure 2A:
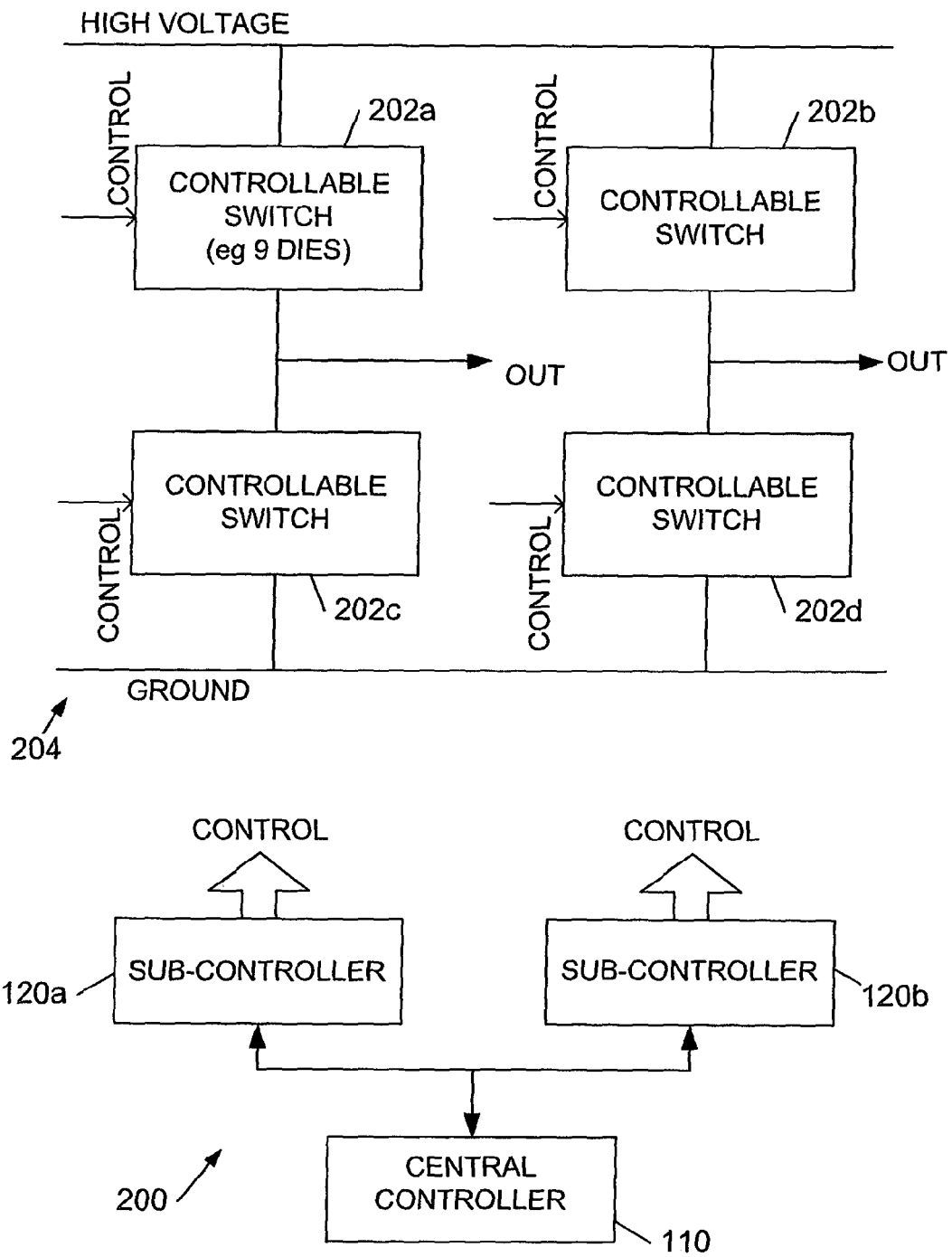
Figure 2B:
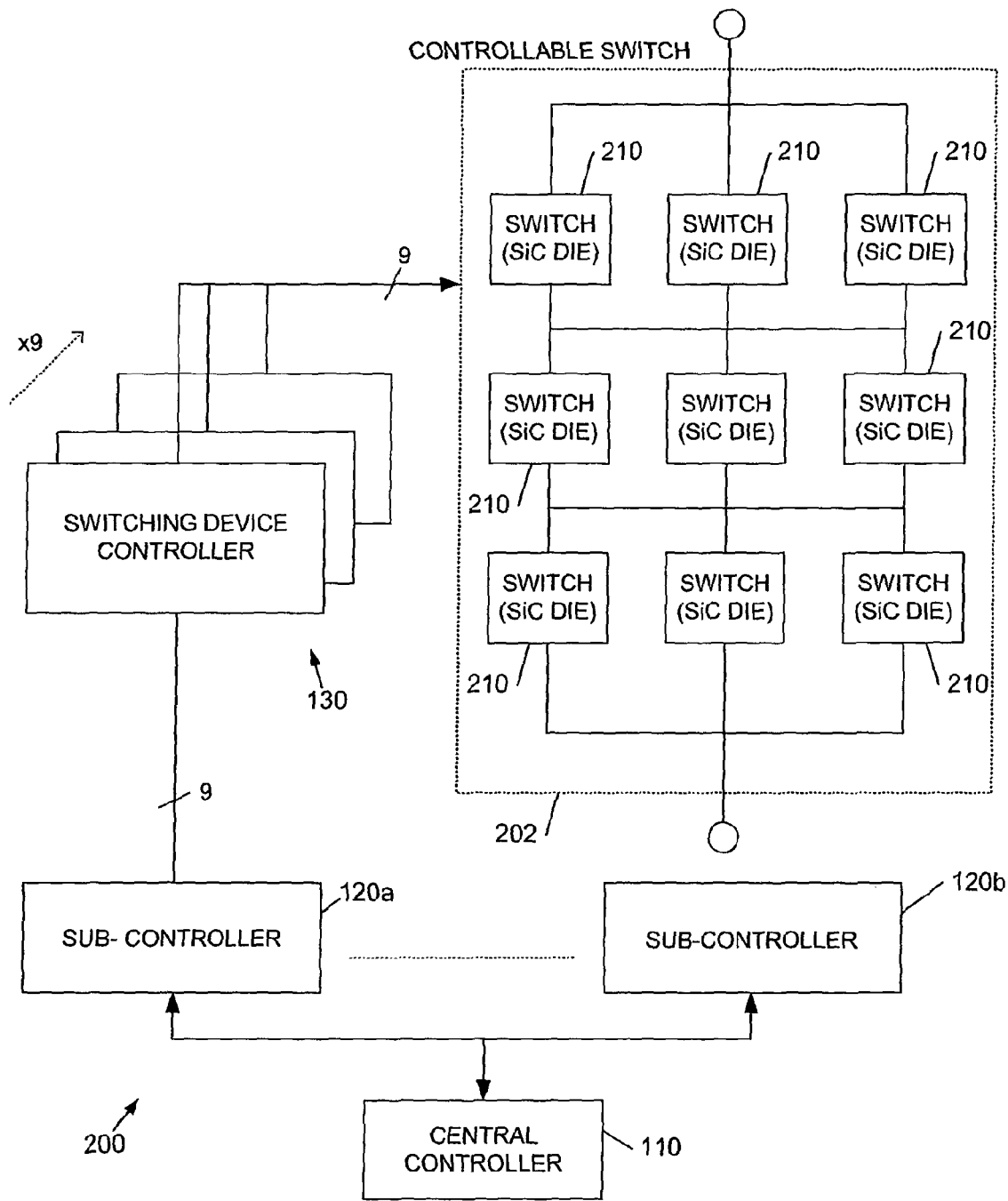

In an electrical power converter such as a full (H-) bridge, half bridge or 3-phase inverter, each switch position may comprise one or more semiconductor switching devices. In high voltage and/or high current applications of the type described in the introduction many semiconductor switching devices may be connected in series and/or parallel, each with a respective switching device controller. FIG. 2*a* shows an example of an H-bridge electrical power converter 200 which may be employed, for example, for converting DC to AC or vice versa. In this example each switch 202*a-d* of the H-bridge 204 comprises a set of semiconductor switching device dies, as shown in more detail in FIG. 2*b*. In the expanded diagram of FIG. 2*b* a single controllable switch 202 comprises 9 power semiconductor switching devices 210, for example each comprising a silicon carbide die, multiple devices being connected in parallel to create a voltage level, sets of multiple devices then being connected in series to series-connect the voltage levels. In other embodiments a single switching device controller may control two or more switches or device dies). Each switch 210 has a respective switching device controller 130 which, in turn, is coupled to one of the sub-controllers 120*a, b*.

As illustrated a separate bus runs between a sub-controller and a switching device controller so that there is one such bus for each switching device controller. In one illustrative system a sub-controller provides 30 separate bus connections to respective switching device controllers and thus for the example H-bridge of FIG. 2*a*, which employs 36 semiconductor switches, two sub-controllers are employed. The skilled person will recognise that in a high-voltage and/or current power electrical circuit with multiple switches hundreds or potentially thousands of semiconductor switching devices may be employed. In such an arrangement the power semiconductor switching devices should be connectable in series and in parallel and the switching device controllers system should be able to control the switching of these devices so that they switch in synchronism, in effect substantially simultaneously.

To facilitate simultaneous control a number of switch states are defined. These are broadly as follows (although more or fewer states may be employed in other implementations):

State 1: FULLY OFF—the switch is turned off, only leakage current flows
State 2: OFF WITH LOW GATE VOLTAGE—the switch is turned off but close to the gate threshold voltage
State 3: ACTIVE LOW CURRENT—the switch is active but in a state where there is a defined low current flowing
State 4: ACTIVE LOW VOLTAGE—the switch is active but in a state where there is a defined low voltage (above the saturation voltage) across it
State 5: ON WITH HIGH GATE VOLTAGE—the switch is turned on and in saturation but may not be fully saturated
State 6: SATURATED ON—the switch is in a saturated on condition Communication of the required switch state is by real-time messages from the central controller to the switching devices. In addition configuration and monitoring data can be exchanged by non-real-time messages.

In broad terms when the device, say an IGBT power semiconductor switching device, is off there will be a high voltage across the device—for example of order 1 KV. There will be substantially zero current (just the leakage current) and substantially zero gate voltage (or, depending on the device, a negative gate voltage). Injecting current into the gate increases the gate voltage a little so that it begins to pass a small current, for example of order 0.1-1 amp; this effectively makes series-coupled devices simultaneously active. To achieve this state may take, for example, of order 50 ns-1 μs, taking into account the time to charge the gate, and propagation delays. From this state, further injection of current into the gate further increases the gate voltage to reach a state where the device is passing substantially more current, for example of order of 100 amps, and there is still a residual or 'active' low voltage across the device, for example of order 10 volts. Eventually the gate voltage is driven to its full voltage which may be, for example, of order 15 volts for a silicon device or 20 volts for a silicon carbide device, at which point the device is saturated, passing its full current and has a minimal, saturated (fully)-on voltage across the device, for example of order 2 volts.

The above outline description is a simplification and we will now describe some example states and transitions in more detail.

Figure 3A:
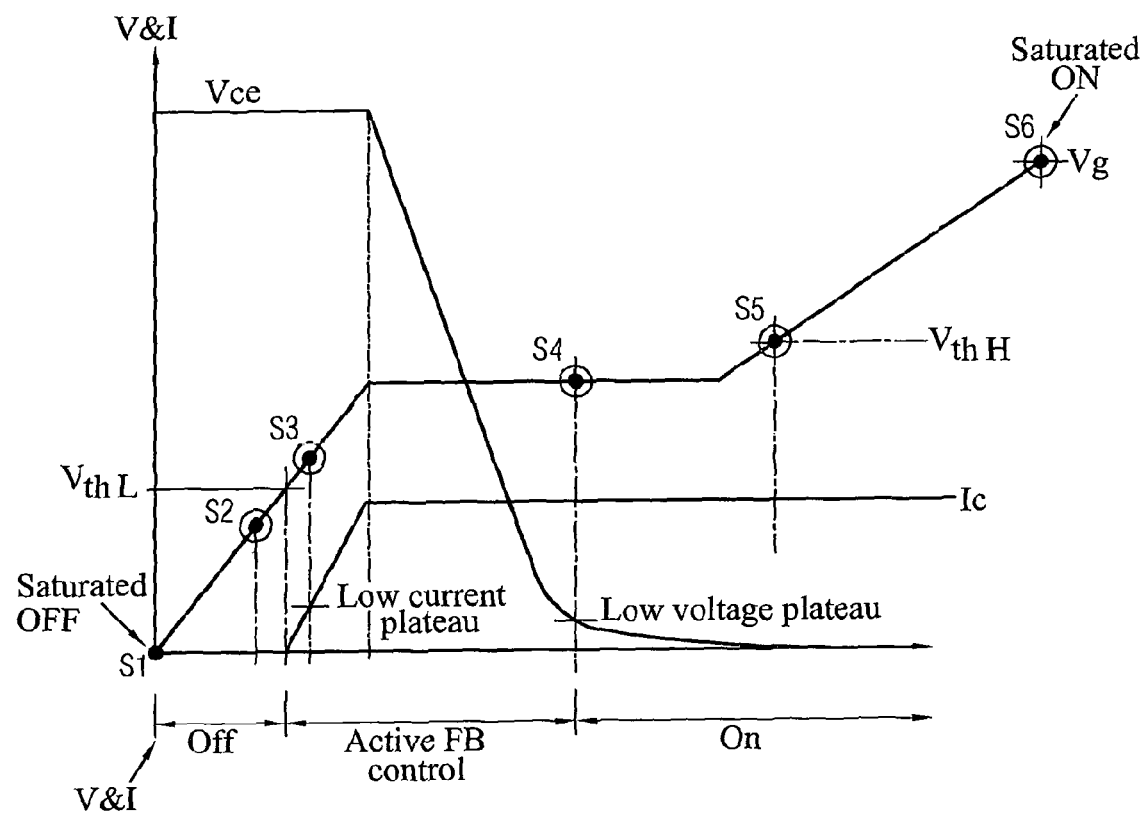
FIGS. 3a to 3c show curves of current/voltage against gate charge for an IGBT, illustrating a plurality of different intermediate states into which the IGBT may be controlled by an embodiment of a switching device controller according to the invention, and first and second examples of device circuit topologies switching, respectively, a resistive load and an inductive load.

Referring now to FIG. 3*a*, this shows graphs of collector emitter voltage, Vce, collector current, Ic, and gate voltage Vg, against gate charge, Qg, for the IGBT of FIG. 1. Preferred embodiments of the switching device controller view the IGBT as a current-controlled or charge-controlled device rather than as a voltage-control device, and achieve this by driving the gate of the IGBT with a controllable current source. Although the gate electric field (and gate voltage) is a function of the gate charge, there is a distinct difference between viewing the device as current-controlled and driving the device from a current source as compared with driving the device from a voltage source, even a low impedance voltage source. This is because the device has an inherent gate capacitance (between the gate and emitter or source), and also a Miller capacitance (between the gate and collector or drain) which has a value depending upon the rate of change of Vce. Driving the IGBT with a current drive enables the device to be transitioned through states in which one or both of Vce and Ic change but in which the Vg is substantially constant. Further, driving the device with a controllable current/charge facilitates control of dV/dt of Vce and dI/dt of Ic.

Thus referring to FIG. 3*a*, in an initial state S1 the device is fully off, there is substantially zero gate charge, and the gate voltage is also substantially zero. In this condition Vce is substantially a maximum—that is the device is supporting the full applied voltage across the collector and emitter terminals, and Ic is substantially zero, that is only a negligible leakage current flows. FIG. 3*a* shows curves for an example device which is turned off with zero gate voltage but, as the skilled person will be aware, depending upon the particular device, the gate charge Qg and gate voltage Vg may alternatively both be negative when the device is fully off.

As charge is injected onto the gate of the IGBT the gate voltage gradually rises, and the device may be brought to a second state, S2, in which the device is still fully-off but in which the gate voltage is just below that at which the device will start to turn on. We refer to this as a low threshold voltage, VthL, and this is the gate voltage at which it can be guaranteed that under no circumstances as defined by the conditions of use of the device (temperature range), will the device become active. This low threshold voltage is a function of temperature and of the device itself. Typically for a power IGBT this voltage may be of order 3 volts.

Continuing to inject charge onto the gate of the IGBT moves the device from state S2 to state S3. In state S3 the device is partially turned on (active) and a controlled low current is flowing through the device. As charge is injected onto the gate the low threshold voltage of the device is reached and the IGBT begins to conduct. As more charge is injected the device conducts more and the collector current Ic ramps up with injected charge as shown. The location of state S3 is defined by a defined value of collector current at which the device is held in a low current plateau (i.e. a point at which a defined collector current flows through the device, which is held constant by the feedback control system).

Figure 3B:
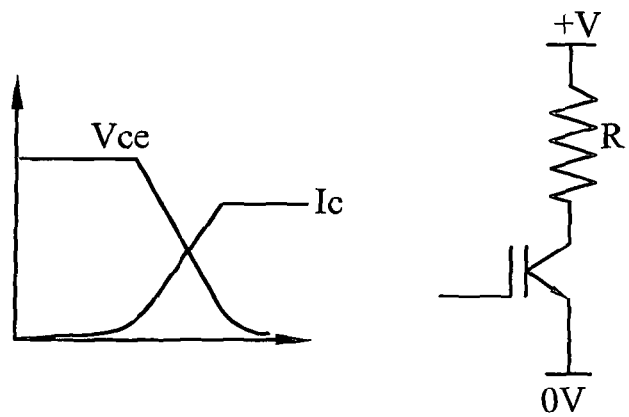
Figure 3C:
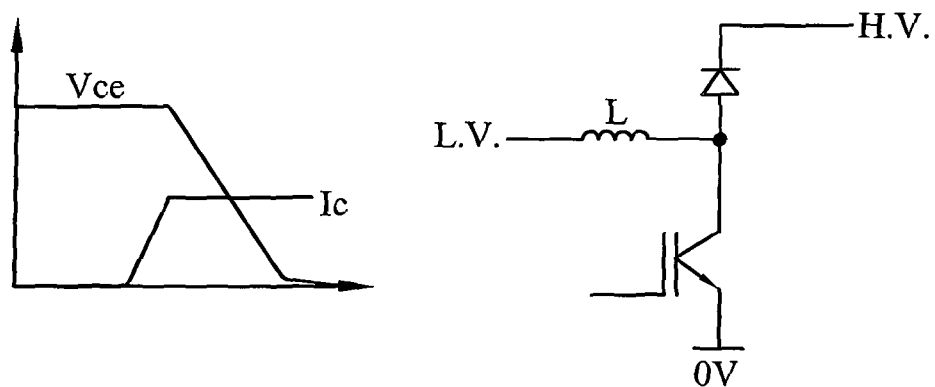

As further charge is injected into the gate of the switch device, the device transitions from state S3 to state S4. During this transition the collector current builds up to a maximum value and the collector-emitter voltage falls to close to a minimum value across the device. The precise shape of the Vce and Ic curves between states S3 and S4 depend upon the topology of the circuit in which the device is connected and the associated circuit inductance/capacitance/resistance: for example with a resistive load the collector current increases linearly as the collector-emitter voltage decreases linearly. By contrast with a diode load the collector current may increase rapidly once the diodes switching threshold is reached. This is illustrated schematically in FIGS. 3b and 3c which show, respectively, an IGBT switching a resistive load, and an inductive diode clamped circuit for example of the type found in a typical boost converter configuration, with the IGBT switching an inductive load. With an inductive diode clamped load the collector current may first increase linearly whilst the voltage remains unchanged, up to a maximum point, before the voltage falls linearly to a minimum point whilst the current remains unchanged.

The skilled person will appreciate, however the precise transitions of the Vce and Ic curves in the region between states S3 and S4 are not relevant since the start and end points, i.e. the respective states, are both well-defined. Thus in state S4 the device is on (active) but still supporting a collector-emitter voltage which is above Vce when the device is saturated on. The location of state S4 is defined by the Vce voltage value of this low voltage plateau; this may, for example, be of order 10-50 volts.

In state S4 the gate voltage is below what we term a high threshold voltage, VthH. This high threshold voltage is the minimum voltage at which, as the gate voltage is reduced, the device just starts to come out of saturation. Thus in moving from state S4 to state S5 the device is fully turned on and taken into saturation. In continuing to inject charge into the gate of the IGBT, the gate voltage remains substantially constant until the associated gate capacitance is charged and then rises until the high threshold voltage, VthH, is reached, state S5 being defined by a gate voltage equal to (or greater than) this high threshold voltage. Put another way, one can guarantee that if the gate voltage is taken down to VthH, the device remains in saturation. A typical value for VthH is in the range 7-9 volts; at voltages greater than this, for example 10-15 volts (or up to of order 20 volts for a silicon carbide device) the device is fully saturated. The upper threshold voltage depends, in part, on the current which the device is passing.

In an embodiment states S2 and S5 may be defined by comparison of the gate voltage with defined reference voltage values. These may be programmed into the controller, for example into one or more registers of the controller and/or the controller may be provided with a learn mode to learn the points at which the device just begins to come out of saturation/just begins to become active, optionally then applying a margin of error for temperature variation.

Continuing to inject charge into the gate of the IGBT now continues to increase the gate voltage until a state S6 is reached at which the device is fully saturated on. State S6 is defined by a gate voltage value which may, for example, be programmed into the controller.

The curves illustrated in FIG. 3a are bi-directional: that is the device may be moved between any of the illustrated states by injecting charge onto/removing charge from the gate of the IGBT. In particular, the achievement of states S3 and S4 are defined by values of the low current plateau and low voltage plateau of the device, although in operation the timing is dependent upon the circuit in which the device operates—for example the timing of the transition from state S3 to S4 depends upon how quickly Vce collapses.

In some preferred embodiments of the controller an active feedback control loop is employed to move the switching device between states S3 and S4, more particularly between states S2 and S5. In preferred embodiments this active control employs a control loop which simultaneously controls both Vce and Ic in tandem, by controlling the device to behave as it if were a passive resistor. Thus in embodiments this active feedback control defines a ratio between Vce and Ic. This determines an effective resistance for the switching device, and the device is moved from one state to another by changing the effective target resistance for the device, the feedback loop then operating to maintain the voltage and current in the defined ratio.

Thus, broadly speaking, the controller operates to move the switching device between states S1 to S6, bi-directionally, where S2 and S5 (and effectively S1 and S6) may be fixed from the device datasheet, and where S3 and S4 are defined by the choice of low current plateau and low voltage plateau levels. In embodiments the low current plateau may comprise a very low current, for example, less than 100 mA, 10 mA, 1 mA or 0.1 mA.

Figure 4:
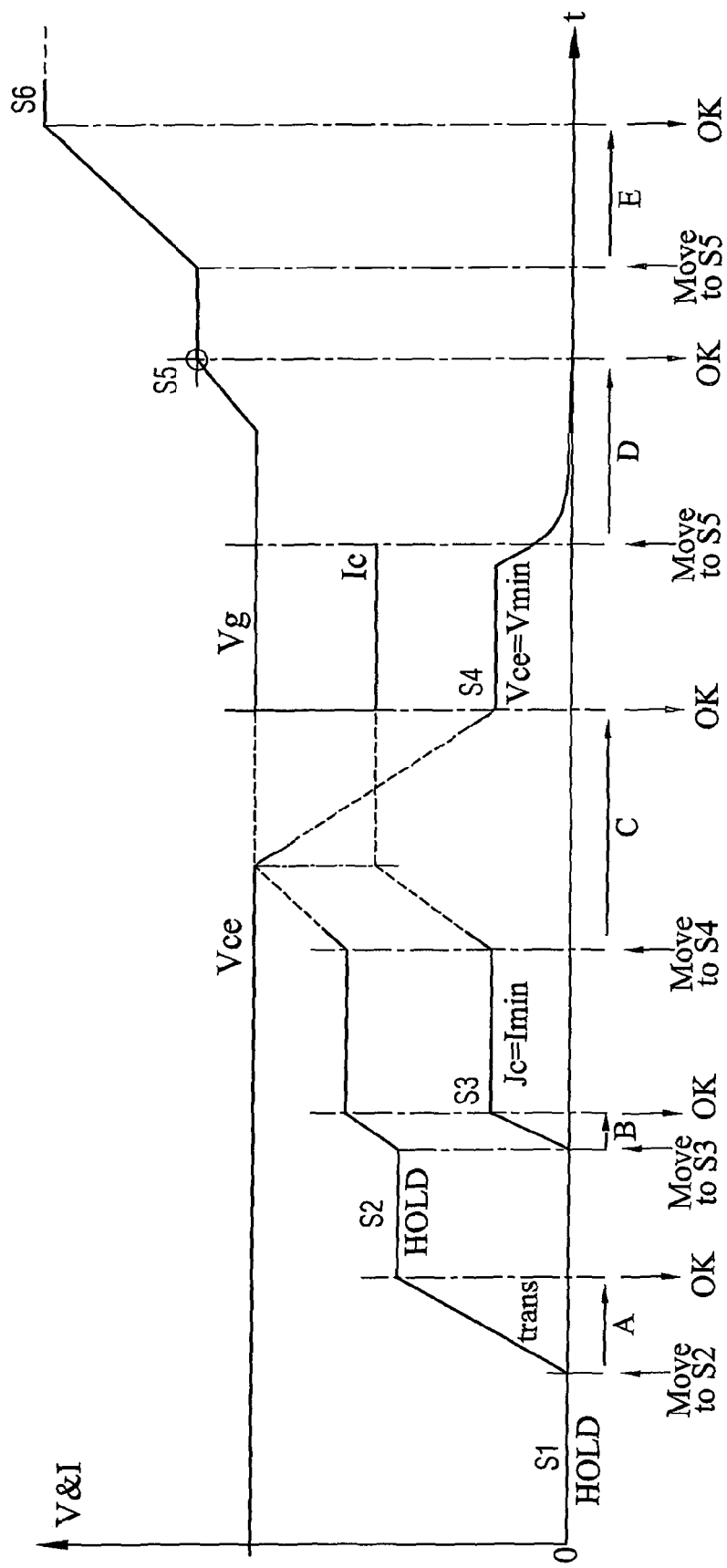
FIG. 4 shows curves of voltage/current for an IGBT against time, illustrating states and transitions of the device provided by the switching device controller together with switch state change commands and the response when a transition to new state is completed.

Movement between the various states in time is illustrated in FIG. 4. FIG. 4 shows voltage/current on the Y-axis again illustrating variations of Vce, Ic and Vg, but in this Figure these variations are shown against time on the X axis rather than against gate charge. In the illustrated example the device begins in saturated off-state S1 and moves towards the saturated on-state S6, and thus shows a device turning on. Correspondingly, however, a similar set of curves may be followed in the opposite direction to turn the device off. As illustrated by the annotations on the time axis, the device is transitioned from one state to another by the switching controller receiving a command to move to a particular state, for example 'move to S2', and once the relevant state has been reached the switching controller returns an acknowledgement, 'OK'. In the context of the previously described system a switching device controller receives a state change command from a central or sub-controller. To control a plurality of switches in synchronism the central or sub-controller sends a command to the plurality of devices all to move the to the same, defined state, and then waits for an acknowledgement from all these switching device controllers before proceeding to send out the command for the next state change. In this way the switches are controlled to move in synchronism. This also facilitates balancing of currents/voltages between multiple devices during the switching process so that, for example, one device does not see the entire voltage/current for the set before the others have switched. Further, because movement between the states is reversible, if a fault is detected (or indicated by a switching device controller) one or a group of devices can be moved back to an earlier state. This may be used to return a set of switching devices to a known 'good' or safe state on detection of a fault or potential fault, in order to reduce the risk of collateral damage amongst devices.

The states illustrated in FIG. 4 correspond to those shown in FIG. 3a, but in FIG. 4 because the states persist for a hold time period each state is indicated by a plateau rather than a point on the relevant curve. Some of the transitions between states illustrated in FIG. 4 have no time constraints: for example transitions between states S1 and S2 and S5 and S6 may occur slowly because there is no change in Vce or Ic in these regions. Thus there is no time constraint on the commands issued by the central/sub-controller as regards these states. By contrast it is preferable for states S3 and S4 to be of relatively short duration and, over the region between states S2 and S5 in which Vce and Ic are changing together, it is preferable to apply local feedback control to control the transitions between these states.

Figure 5:
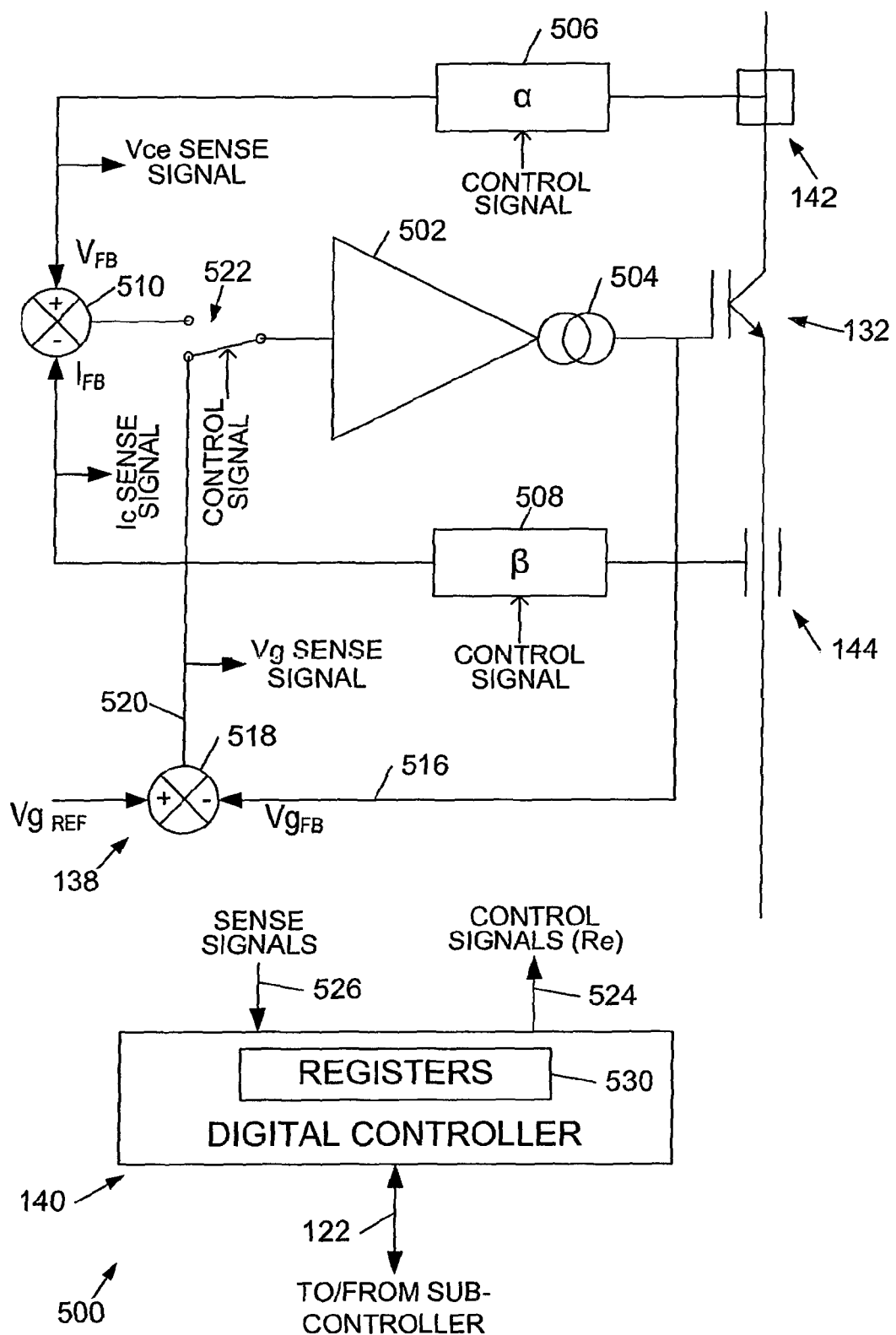
FIG. 5 shows a schematic circuit diagram of an embodiment of a power semiconductor switching device controller according to the invention.

Referring now to FIG. 5, this shows a power semiconductor switching device controller 500 according to an embodiment of the invention, configured to control a power semiconductor switching device into a selected one of the above described states S1 to S6. Like elements to those of FIG. 1 are indicated by like reference numerals.

In FIG. 5 the analogue control circuitry 138 comprises an amplifier 502 driving a controllable current source (and sink) 504 which in turn provides a current drive signal to the gate of IGBT 132. A voltage feedback circuit 142 provides a voltage sense signal to a scaling circuit 506 to scale the sensed signal by a factor alpha, and a current sensing circuit 144 provides a current sense signal to a second scaling circuit 508 which scales the current sense signal by a factor beta. The scaled voltage and current sense signals are provided to a combining circuit 510, more particularly a differencing circuit which provides an error signal for the current amplifier 502, 504. Together, these circuit blocks provide an active feedback control mechanism that is designed to hold the switch device in a defined state depending upon the sensed voltage and current in the external switch circuit.

A second, threshold state control loop is provided by a gate voltage feedback line 516 which is compared, in circuit 518, with a gate voltage reference to derive a gate voltage control output 520, also for providing an error signal to the current amplifier 502/504. A switch 522 is able to switch between the output of the active state control loop and the gate voltage control loop so that gate voltage control may be applied up to state S2 and beyond state S5, and the active state control loop applied between states S2 and S5.

The digital controller 140 provides a set of control signals to set the feedback gain parameters alpha and beta, the voltage and current offset values, the gate voltage reference, and the position of switch 522. The controller also receives sensed signals to sense values of Vce, Ic and Vg. The controller includes a set of registers 530 for storing various control system parameters for each state S1 to S6.

In the switch position shown the sensed gate voltage is compared to the reference (or demanded) gate voltage signal to produce an error signal. This error signal not only drives current in or out of the control gate of the Switch Device in a negative feedback control loop, but also can be compared with zero to determine when the target gate voltage has been reached, and hence the desired state S2 or S5 has been achieved. (It is worth noting that the Miller capacitance plays no part here because Vce is substantially unchanging).

To move between states S2 and S5 via states S3 and S4 the digital controller 140 defines an effective resistance value, which is used to calculate the voltage and current feedback gain parameters, that in turn defines the behaviour of the control loop. The measured Vce and Ic sense signals are used to determine an effective resistance and the digital controller controls α and β to move the IGBT to a position on its operating curve defined by the target effective resistance. In the low current plateau state S3 the device has a high target resistance; in the low voltage plateau state S4 the device has a low target resistance. The target resistance is altered to move between states S3 and S4, and one may write the equation:

$$\frac{\alpha V_{FB}}{\beta I_{FB}} = R_e.$$

This comes from ohms law: V=I×R; there is always a combination of V and I that satisfies the relationship for the control loop, as would be the case for a real passive resistor.

Thus in embodiments the control system operates so as to make the relationship of this equation true. Any deviation from this equality produces an error signal that drives the control gate of the switch device in such a fashion as to correct for this deviation and drive the error signal to zero. This is the principle of operation of the negative feedback loop. The control loop gain parameters Alpha and Beta are accordingly adjusted to give the desired control relationship between V and I for a specified state S1 to S6. This effectively sets the Re value (effective resistance) for the state. In embodiments the digital controller 140 may operate to define a target resistance for the device in say, state S3 and then change this target resistance to move the device to state S4 (or vice-versa).

Although not shown in FIG. 5, in some preferred implementations the digital controller also provides additional functions, for example to implement a command to enter a sleep mode, shut down mode, or the like. Further the digital controller is preferably able to send monitoring and status/ warning data back over bus 122, for example to provide information on the sensed voltages/currents and/or warnings of potential fault conditions such as over-current, over-voltage or over-temperature. In embodiments the interface to the digital controller is a packet data interface, which has the ability to handle both real-time (high priority) and non-real-time (lower priority) data packets. In such a case the high priority/real-time data packets may be used to receive state commands at the switching device controller and to return acknowledgement signals, and the non-real-time (lower priority) may be employed for monitoring/status/warning data.

FIG. 6 further illustrates the register bank arrangement which may be employed with the switching device controller of FIG. 5: it is desirable to be able to update the configuration of the switching device controller at a defined time, for example when a switching action is not taking place. However the configuration data may be too large to send in a real-time data packet, and thus in embodiments, the configuration information is updated in a two stage process making use of a 'shadow configuration'.

Thus referring to FIG. 6, a switching device controller may incorporate a pair of register banks 154a,b, one of these storing shadow configuration data and the other storing active configuration data. When a configuration change is desired the shadow configuration data is updated for all of the relevant switching device controllers, for example using low priority non-real-time data. Changes to the shadow configuration have no effect on the switching behaviour of the device controller. Then, when it is desired to activate the updated configuration, a single real-time action command may be employed, either to switch the designation of the active register bank or to copy data from the shadow register bank to the active register bank.

The techniques we have described are suitable for controlling a switching device at any current or voltage, although they are particularly advantageous for controlling power semiconductor switching devices.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A system (100) comprising a commander and a plurality of semiconductor switching device controllers, the commander to control the semiconductor switching devices in synchronism by sending a command to the plurality of semiconductor switching devices all to move to a defined, intermediate state, before proceeding to send out a command for a next state change, each said semiconductor switching device controller for controlling a semiconductor switching device into a selected one of a plurality of states, the states including a fully-off state, a saturated-on state, and at least one said intermediate state between said fully-off state and said saturated-on state, said semiconductor switching device having first and second input/output terminals and a control terminal, each of the switching device controllers comprising:

an interface to receive device command data and defining a commanded said state for said switching device;

a voltage sense input to sense a voltage on a said input/output terminal of said switching device;

a current sense input to sense a current passing through said semiconductor switching device via said input/output terminals;

a control output to provide a drive signal to said control terminal of said switching device;

a feedback control circuit coupled to said voltage sense input, to said current sense input and to said control output, to provide said drive signal responsive to said sensed voltage and sensed current, wherein said feedback control circuit has one or more adjustable parameters, and wherein said a response of said drive signal to said sensed voltage and sensed current is dependent on said one or more adjustable parameters; and a circuit controller coupled to said interface and to said feedback control circuit, wherein said circuit controller is configured to control said one or more adjustable parameters responsive to said command data; and wherein a state of said one or more adjustable parameters determines a state of said switching device set by said drive signal from said feedback control circuit, and wherein said commanded states define states of said one or more adjustable parameters for said circuit controller to control said semiconductor switching device into said fully-off state, said saturated-on state, and said at least one intermediate state.

2. A system as claimed in claim 1, comprising a said switching device controller wherein said semiconductor switching devices is an insulated gate device, and wherein said feedback control circuit comprises a controllable current drive circuit to control a charge flowing into/out of said control terminal responsive to said state of said one or more adjustable parameters.

3. A system as claimed in claim 1, comprising a said switching device controller wherein said feedback control circuit is a negative feedback control circuit configured to control said semiconductor switching device to a resistance value, wherein said one or more adjustable parameters comprise one or more control loop gain parameters of said negative feedback control circuit, and wherein said circuit controller is configured to control said one or more control loop gain parameters to adjust said resistance value to move said semiconductor switching device between states of said plurality of states.

4. A system as claimed in claim 1, comprising a said switching device controller further comprising a switching device state detection system coupled to one or more of said voltage sense input, said current sense input, and said control output, to detect when said switching device is in said commanded state, and wherein said circuit controller is configured to send acknowledgement data from said interface when said commanded state is reached.

5. A system as claimed in claim 1, comprising a said switching device controller wherein said at least one intermediate state comprises an off-threshold state in which said drive signal is at a voltage greater than zero and less than a turn-on threshold voltage of said semiconductor switching device, and wherein said parameters comprise a first voltage reference parameter.

6. A system as claimed in claim 1, comprising a said switching device controller wherein said at least one intermediate state comprises an on-threshold state in which said drive signal is at a voltage less than a voltage of said drive signal for said saturated-on state and greater than a turn-off threshold voltage of said semiconductor switching device, and wherein said parameters comprise a second voltage reference parameter.

7. A system as claimed in claim 1, comprising a said switching device controller wherein said at least one intermediate state comprises a threshold state defined by a value of said drive signal, and wherein said feedback control circuit comprises a threshold state control feedback loop having an input from said control output and configured to control said drive signal to a value defined by a said adjustable parameter corresponding to a commanded said threshold state.

8. A system as claimed in claim 1, comprising a said switching device controller wherein said at least one intermediate state comprises an active state of said semiconductor switching device, and wherein said feedback control circuit comprises an active state control loop having an input from one or both of said voltage sense input and said current sense input and configured to control said drive signal to a value defined by a one or more said adjustable parameters corresponding to a commanded said active state.

9. A system as claimed in claim 8 wherein said active state comprises an active low current state in which said sensed current is greater than zero and less than a value of said sensed current in said saturated-on state of said semiconductor switching device.

10. A system as claimed in claim 8 wherein said active state comprises an active low voltage state in which said sensed voltage is less than said sensed voltage in said fully-off state and greater than said sensed voltage for said saturated-on state.

11. A system as claimed in claim 8 wherein said active state control loop comprises a first control circuit coupled to said voltage sense input and a second control circuit coupled to said current sense input, wherein said first control circuit comprises a circuit responsive to a first, voltage scaling parameter to scale said sensed voltage, wherein said second control circuit comprises a circuit responsive to a second, current-scaling parameter to scale said sensed current, and wherein said circuit controller is configured to control a transition to/from said commanded active state by changing one or both of said voltage-scaling parameter and said current scaling parameter, to control an effective resistance of the semiconductor switching device.

12. A system as claimed in claim 1, comprising a said switching device controller wherein said circuit controller is configured to control said one or more adjustable parameters to define two or four said intermediate states.

13. A system as claimed in claim 12 wherein said intermediate states comprise an active low current state in which said current passing through said semiconductor switching device is intermediate between a fully-off current and a saturated-on current, and an active low voltage state in which said sensed voltage is intermediate between a fully-off voltage and a saturated-on voltage of said semiconductor switching device.

14. A system according to claim 1 having a said semiconductor switching device controller for controlling a semiconductor switching device, said semiconductor switching device having first and second input/output terminals and a control terminal, the switching device controller comprising:
    a control input to receive a control signal for controlling a state of said semiconductor switching device;
    a voltage sense input to sense a voltage on a said input/output terminal;
    a current sense input to sense a current passing through switching device via said input/output terminals;
    a control output to provide a drive signal to said control terminal; and
    a feedback control system coupled to said voltage sense input, to said current sense input and to said control input and to said control output;
    wherein said control signal defines a target effective resistance of said semiconductor switching device, and wherein said feedback control circuit is configured to control said drive signal such that said sensed voltage and said sensed current together implement said target effective resistance.

15. A system as claimed in claim 14 wherein said feedback control system is a negative feedback control system configured to provide a drive signal dependent on the difference between said target effective resistance and a device resistance determined from said sensed voltage and said sensed current, and wherein said negative feedback control system is configured to reduce said difference towards zero.

16. A system as claimed in claim 15 further comprising a differencer coupled to said first and second control circuits to provide a difference signal dependent on a difference between said scaled sensed voltage and said scaled sensed current, and a driver circuit, coupled to said differencer and to said control output, to provide said drive signal responsive to said difference signal.

17. A system as claimed in claim 16 wherein said semiconductor switching device is an insulated gate device, and wherein said driver circuit comprises a controllable current device circuit to control a charge flowing into/out of said control terminal of said semiconducting switching device responsive to said difference signal.

18. A system as claimed in claim 14 wherein said feedback control system comprises a first control circuit coupled to said voltage sense input to a second control circuit coupled to said current sense input, wherein said first control circuit comprises a circuit responsive to a first, voltage scaling parameter to scale said sensed voltage, wherein said second control circuit comprises a circuit responsive to a second, current-scaling parameter to scale said sensed current, wherein said first control circuit and said second control circuit are coupled to provide a signal defining a sensed device resistance of said semiconductor switching device, and wherein said drive signal is responsive to a combination of said target effective resistance and said sensed device resistance.

19. A system as claimed in claim 18 wherein said control input is coupled to control said voltage scaling parameters and said current scaling parameters of said respective first and second control circuits to define said target effective resistance.

20. A method of controlling a semiconductor switching device and comprising using the system of claim 1, the method comprising:
    sensing a voltage across first and second input/output terminals of the semiconductor switching device;
    sensing a current flowing between said first and second input/output terminals through said semiconductor switching device; and
    controlling a signal on a control terminal of said semiconductor switching device responsive to said sensed voltage and current such that said semiconducting switching device behaves like a passive resistor,
    wherein said semiconductor switching device is an insulated gate device, and wherein said control connection comprises a connection to said insulated gate, the method further comprising controlling a change injected into or removed from said insulated gate to control a ratio of said sensed voltage to said sensed current responsive to a target effective resistance for the device.

21. A system according to claim 1, comprising a said semiconductor switching device controller for controlling switching of an IGBT, the switching device controller comprising:
    a set of one or more registers to store data defining one or more of a target gate voltage value, Vg, a target collector current value, Ic, a target collector-emitter voltage value, Vce, and a target effective resistance value Re;
    a feedback control loop configured to control said Vg, Ic and Vce of said IGBT; and
    a controller to control said feedback control loop in accordance with said stored data to target one or more of said Vg, Ic, Vce and Re for said IGBT; and
    wherein said controller is configured to target intermediate states defined by one or more of said Vg, Ic, Vce and Re to control said switching of said IGBT.

22. A semiconductor switching device controller as claimed in claim 21 wherein said registers are configured to store data defining said Vg, and either said Ic and Vce, or said Re, and wherein said digital controller is configured to hold said IGBT in a plurality of said intermediate states each defined by one or more of said Vg, Ic, Vce, and Re.

23. A semiconductor switching device controller as claimed in claim 21 wherein said digital controller is configured to target a said intermediate state by controlling said feedback control loop in accordance with a target IGBT resistance defined by a combination of a collector emitter voltage and a collector current of said IGBT.

24. A system according to claim 1, comprising a said semiconductor switching device controller for controlling switching of a MOSFET, the switching device controller comprising:
    a set of one or more registers to store data defining one or more of a target gate voltage value, Vg, a target drain current value, $I_D$, a target drain-source voltage value, $V_{DS}$, and a target effective resistance value Re;
    a feedback control loop configured to control said Vg, $I_D$ and $V_{DS}$ of said MOSFET; and
    a controller to control said feedback control loop in accordance with said stored data to target one or more of said Vg, $I_D$, $V_{DS}$ and Re for said MOSFET; and wherein said controller is configured to target intermediate states defined by one or more of said Vg, $I_D$, $V_{DS}$ and Re to control said switching of said MOSFET.

25. A semiconductor switching device controller as claimed in claim 24 wherein said registers are configured to store data defining said Vg, and either said $I_D$ and $V_{DS}$, or said Re, and wherein said digital controller is configured to hold said MOSFET in a plurality of said intermediate states each defined by one or more of said Vg, $I_D$, $V_{DS}$, and Re.

26. A semiconductor switching device controller as claimed in claim 24 wherein said digital controller is configured to target a said intermediate state by controlling said feedback control loop in accordance with a target MOSFET resistance defined by a combination of a drain-source voltage and a drain current of said MOSFET.

* * * * *